(12) United States Patent
Mohapatra et al.

(10) Patent No.: US 11,024,737 B2
(45) Date of Patent: Jun. 1, 2021

(54) ETCHING FIN CORE TO PROVIDE FIN DOUBLING

(71) Applicant: Intel Corporation, Santa Clara, CA (US)

(72) Inventors: Chandra S. Mohapatra, Hillsboro, OR (US); Glenn A. Glass, Portland, OR (US); Anand S. Murthy, Portland, OR (US); Karthik Jambunathan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/070,207

(22) PCT Filed: Mar. 30, 2016

(86) PCT No.: PCT/US2016/025076
§ 371 (c)(1),
(2) Date: Jul. 13, 2018

(87) PCT Pub. No.: WO2017/171761
PCT Pub. Date: Oct. 5, 2017

(65) Prior Publication Data
US 2019/0035926 A1 Jan. 31, 2019

(51) Int. Cl.
*H01L 29/10* (2006.01)
*H01L 29/78* (2006.01)
(Continued)

(52) U.S. Cl.
CPC ...... *H01L 29/785* (2013.01); *H01L 21/02433* (2013.01); *H01L 21/02546* (2013.01);
(Continued)

(58) Field of Classification Search
CPC . H01L 29/66795–66818; H01L 29/785–7856; H01L 21/30617;
(Continued)

(56) References Cited

U.S. PATENT DOCUMENTS

| | | | |
|---|---|---|---|
| 8,173,551 B2 * | 5/2012 | Bai | H01L 21/02532 438/758 |
| 9,484,439 B1 * | 11/2016 | Cheng | H01L 29/66795 |
| 2008/0099785 A1 * | 5/2008 | Bai | C30B 25/183 257/190 |
| 2013/0043506 A1 * | 2/2013 | Tsai | H01L 29/7853 257/192 |

(Continued)

FOREIGN PATENT DOCUMENTS

KR 10-2015-0054497 5/2015

OTHER PUBLICATIONS

International Search Report and Written Opinion for International Patent Application No. PCT/US2016/025076 dated Dec. 20, 2016, 10 pgs.

(Continued)

*Primary Examiner* — Yu Chen
(74) *Attorney, Agent, or Firm* — Schwabe, Williamson & Wyatt, P.C.

(57) ABSTRACT

A replacement fin layer is deposited on a sub-fin layer in trenches isolated by an insulating layer on a substrate. The replacement fin layer has first component rich side portions and a second component rich core portion. The second component rich core portion is etched to generate a double fin structure comprising the first component rich fins.

20 Claims, 9 Drawing Sheets

(51) Int. Cl.
*H01L 29/66* (2006.01)
*H01L 21/764* (2006.01)
*H01L 29/205* (2006.01)
*H01L 29/267* (2006.01)
*H01L 29/423* (2006.01)
*H01L 29/04* (2006.01)
*H01L 21/02* (2006.01)
*H01L 21/306* (2006.01)

(52) U.S. Cl.
CPC ...... *H01L 21/30617* (2013.01); *H01L 21/764* (2013.01); *H01L 29/045* (2013.01); *H01L 29/1037* (2013.01); *H01L 29/1054* (2013.01); *H01L 29/205* (2013.01); *H01L 29/267* (2013.01); *H01L 29/42376* (2013.01); *H01L 29/66545* (2013.01); *H01L 29/66795* (2013.01); *H01L 29/66818* (2013.01); *H01L 29/7853* (2013.01)

(58) Field of Classification Search
CPC ..... H01L 21/30604–30621; H01L 21/823431; H01L 21/823821; H01L 21/845; H01L 27/0924; H01L 27/1211; H01L 29/1054; H01L 29/205; H01L 29/267; H01L 29/1037; H01L 29/7853; H01L 29/045; H01L 29/42376; H01L 2029/7857–7858
See application file for complete search history.

(56) References Cited

U.S. PATENT DOCUMENTS

| 2013/0105867 | A1 | 5/2013 | Wang et al. |
| 2014/0027860 | A1 | 1/2014 | Glass et al. |
| 2015/0054039 | A1* | 2/2015 | Ching .................. H01L 29/785 257/288 |
| 2015/0132908 | A1 | 5/2015 | Jeong et al. |
| 2015/0249087 | A1* | 9/2015 | Cantoro .............. H01L 27/0924 257/369 |
| 2015/0295090 | A1* | 10/2015 | Tsai .................. H01L 29/66795 257/401 |
| 2015/0357247 | A1 | 12/2015 | Chen et al. |
| 2015/0380491 | A1* | 12/2015 | Augendre ............... H01L 21/31 257/192 |
| 2016/0064544 | A1 | 3/2016 | Jacob et al. |
| 2016/0293760 | A1* | 10/2016 | Glass ................. H01L 29/66818 |
| 2017/0229579 | A1* | 8/2017 | Cheng ................ H01L 29/66795 |
| 2017/0309647 | A1* | 10/2017 | Basker .................. H01L 29/517 |

OTHER PUBLICATIONS

International Preliminary Report on Patentability for International Patent Application No. PCT/US16/25076, dated Oct. 11, 2018, 7 pages.
Office Action from Taiwan Patent Application No. 106105774, dated May 21, 2020, 6 pages.

* cited by examiner

US 11,024,737 B2

ETCHING FIN CORE TO PROVIDE FIN DOUBLING

CROSS-REFERENCE TO RELATED APPLICATION

This patent application is a U.S. National Phase Application under 35 U.S.C. § 371 of International Application No. PCT/US2016/025076, filed Mar. 30, 2016, entitled "ETCHING FIN CORE TO PROVIDE FIN DOUBLING," which designates the United States of America, the entire disclosure of which is hereby incorporated by reference in its entirety and for all purposes.

FIELD

Embodiments as described herein relate to a field of electronic device manufacturing, and in particular, to manufacturing fin-based electronic devices.

BACKGROUND

Generally, III-V materials have higher electron mobility relative to conventional silicon. III-V materials can be used for high performance electronic devices in integrated circuit manufacturing. The III-V material based devices may be used for system-on-chips ("SoCs") applications, for example, for power management integrated circuits ("ICs") and radio frequency ("RF")-power amplifiers. The III-V material based transistors may be used for high voltage and high frequency applications.

Typically, fin-based transistors are used to improve electrostatic control over the channel, reduce the leakage current and overcome other short-channel effects comparing with planar transistors. Deposition of the III-V material fin on a silicon substrate however is a great challenge due to dissimilar properties of the III-V material and silicon. A large lattice mismatch between the III-V material and silicon typically results in high defect densities in the III-V material grown on Si. A large mismatch in thermal expansion coefficient between the III-V material and Si typically results in surface cracks on the III-N material grown on Si. These defects significantly reduce the mobility of carriers (e.g., electrons, holes, or both) in the III-V material and degrade transistor performance.

BRIEF DESCRIPTION OF THE DRAWINGS

Embodiments of the invention may be best understood by referring to the following description and accompanying drawings that are used to illustrate embodiments of the invention. In the drawings.

DETAILED DESCRIPTION

Figure 1:
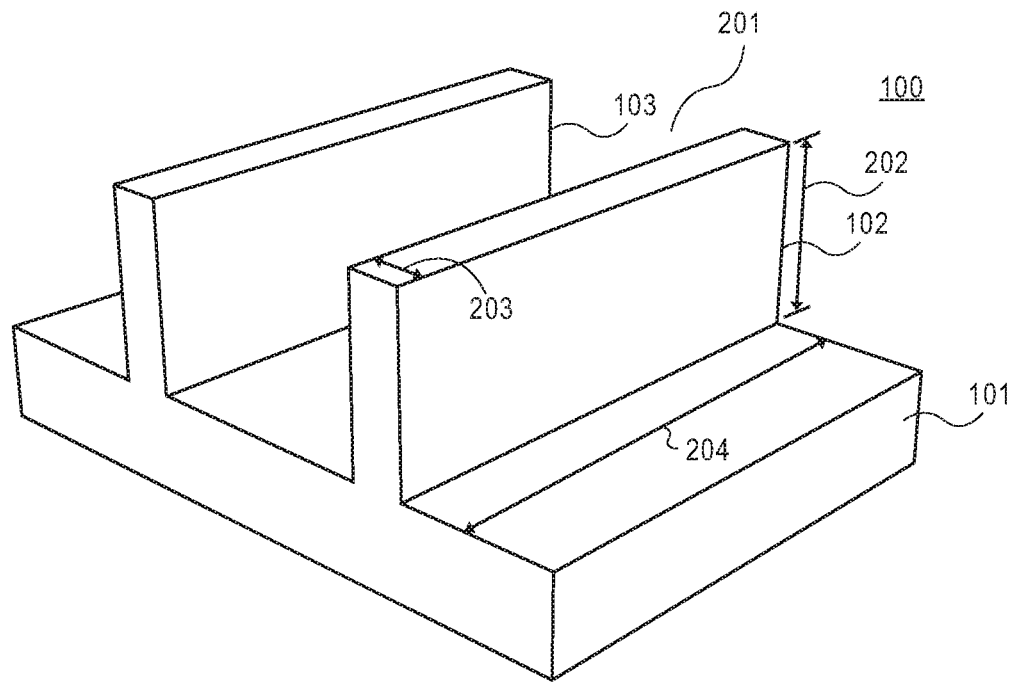
FIG. 1 shows a perspective view of a portion of an electronic device structure according to one embodiment.

Methods and apparatuses to etch a core of a replacement fin to provide fin doubling are described. In one embodiment, a replacement fin layer is selectively deposited on a sub-fin layer in trenches isolated by an insulating layer on a substrate.

The replacement fin layer has first component rich side portions and a second component rich core portion. The second component rich core portion is etched to generate a double fin structure comprising the first component rich fins. In one embodiment, selectively etching the replacement fin core increases carrier mobility and improves performance of the fin based tri-gate or gate all around (GAA) devices comparing with conventional techniques.

Generally, an indium gallium arsenide (InGaAs) layer deposited in a trench on a III-V buffer is an inhomogeneous composition layer. A portion of the InGaAs layer that has indium (In) concentration greater than that of gallium ("In-rich portion) is deposited at the edges of the fin and a portion of the InGaAs layer that has gallium (Ga) concentration greater than that of indium ("Ga-rich portion) is deposited at the center (core) of the fin.

Generally, the indium-rich InGaAs material has lower bandgap and higher mobility relative to the gallium-rich InGaAs material. Typically, the indium-rich portion in the InGaAs fin controls the trans-conductance and mobility of the transistor fabricated later on in a process. Typically, to counter short channel effects and improve electrostatic control, the transistor fin is trimmed at the edges to narrow the fin body. Because InGaAs on an III-V buffer in an aspect ratio trapping (ART) trench naturally grows with a Ga-rich core and In-rich sides, the trimming at the In-rich edges of the fin would result in an In-deficient fin. Such indium-deficient InGaAs fin would result in degraded mobility and transistor performance.

In one embodiment, in contrast to a complex epitaxial growth process development that would be needed to fabricate uniform indium-rich InGaAs fin, a simple method involving selectively etching the gallium rich core of the fin is used to create two substantially uniform indium rich InGaAs fins. Transistors fabricated using embodiments described herein have improved trans-conductance and increased mobility relative to as-grown inhomogeneous InGaAs fin fabricated using conventional techniques.

In one embodiment, a fin doubling method involves etching off the Ga-rich core in an as-grown InGaAs fin. In one embodiment, the gallium-rich center portion of the InGaAs fin is selectively etched with respect to the indium-rich edge portions of the InGaAs fin to create two indium-rich fins formed at the un-etched indium-rich sides of the original InGaAs fin, as described in further detail below.

In one embodiment, etching out the Ga-rich core from an InGaAs fin using the etch-selectivity of Ga-rich InGaAs with respect to In-rich InGaAs to provide fin doubling results in high performing transistors compared to the method of growing homogeneous single InGaAs fin transistors which need complicated and rigorous epitaxial process development.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without specific details. In other instances, well-known features are omitted or simplified in order not to obscure the illustrative implementations.

Various operations will be described as multiple discrete operations, in turn, in a manner that is most helpful in understanding the present invention; however, the order of description should not be construed to imply that these operations are necessarily order dependent. In particular, these operations need not be performed in the order of presentation.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

FIG. 1 shows a perspective view 100 of a portion of an electronic device structure according to one embodiment. A plurality of native fins, such as a native fin 102 and a native fin 103 are formed on a substrate 101, as shown in FIG. 1. In one non-limiting embodiment, a height 202 of the fins is from about 100 nanometers (nm) to about 500 nm. In one non-limiting embodiment, a width 203 of the fins is from about 5 nm to about 100 nm. In one non-limiting embodiment, a length 204 of the fins is from about 100 nm to about 100 microns (µm). In alternative embodiment, the dimensions of the fins are determined by design.

In an embodiment, the substrate 101 includes a semiconductor material, e.g., monocrystalline silicon ("Si"), germanium ("Ge"), silicon germanium ("SiGe"), a III-V material based substrate, a II-VI material based substrate, or any combination thereof.

In an embodiment, the substrate 101 is a substrate having aligned along a predetermined crystal orientation. Generally, the crystallographic orientations (e.g., (100), (111), (110), and other crystallographic orientations) are known to one of ordinary skill in the art of microelectronic device manufacturing. In an embodiment, substrate 101 is a semiconductor-on-isolator (SOI) substrate including a bulk lower substrate, a middle insulation layer, and a top monocrystalline layer aligned along a predetermined crystal orientation, for example, <100> crystal orientation. The top monocrystalline layer may comprise any material listed above, e.g., silicon, germanium. In an embodiment, substrate 101 is a silicon substrate, a silicon-on-insulator (SOI) substrate, a silicon-on-nothing (SON) substrate, a germanium substrate, a germanium-on-insulator (GOI) substrate, a germanium-on-nothing (GON) substrate, or any combination thereof.

In one embodiment, substrate 101 is a monocrystalline Si substrate. In another embodiment, substrate 101 is a polycrystalline silicon substrate. In yet another embodiment, substrate 101 is an amorphous silicon substrate. In one embodiment, substrate 101 represents a previous interconnect layer.

In various implementations, the substrate can be, e.g., an organic, a ceramic, a glass, or a semiconductor substrate. In one implementation, the semiconductor substrate may be a crystalline substrate formed using a bulk silicon, or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group IV, or group II-VI materials. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present invention.

In one embodiment, forming native fins 102 and 103 involves removing portions of substrate 101 exposed by a patterned hard mask layer (not shown) deposited thereon to form a plurality of trenches, such as a trench 201. In one embodiment, trench 201 is a shallow trench recess. As shown in FIG. 1, each of the native fins 103 and 102 extends vertically from the top surface of the substrate 101. In at least some embodiments, each of the native fins 102 and 103 is a silicon fin, a germanium fin, a III-V fin, or any other material fin. In at least some embodiments, the portions of the substrate 101 exposed by the patterned hard mask layer are removed using one or more etching techniques known to one of ordinary skill in the art of microelectronic device manufacturing, such as but not limited to dry etching, wet etching, or both. In at least some embodiments, the portions of the substrate 101 exposed by the patterned hard mask layer are removed using an anisotropic etching technique known to one of ordinary skill in the art of microelectronic device manufacturing.

Figure 2:
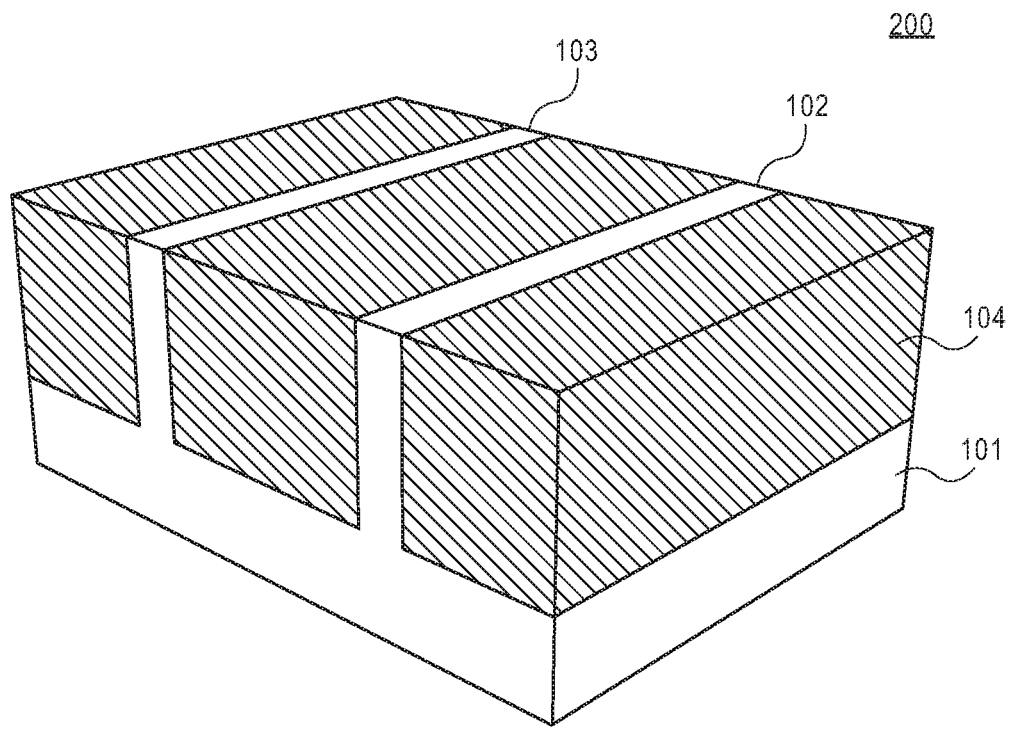
FIG. 2 is a view similar to FIG. 1, after an insulating layer is deposited into the trenches on the substrate and planarized according to one embodiment.

FIG. 2 is a view 200 similar to FIG. 1, after an insulating layer 104 is deposited into the trenches on the substrate 101 and planarized to level out the top surfaces of the fins with the top surface of the insulating layer according to one embodiment. As shown in FIG. 2, insulating layer 104 is deposited on the sidewalls of the native fins 102 and 2103 and on the exposed portions of the substrate 101 to fill the trenches, such as trench 201. In one embodiment, the insulating layer is planarized using a polishing process, e.g., a chemical-mechanical planarization ("CMP") process known to one of ordinary skill in the art of microelectronic device manufacturing.

The insulating layer 104 can be any material suitable to electrically insulate adjacent devices and prevent leakage. In one embodiment, insulating layer 104 is a shallow trench isolation (STI) layer to provide field isolation regions that isolate one device from other devices on substrate 101. In one embodiment, insulating layer 104 is an oxide layer, e.g., a silicon oxide, an aluminum oxide layer, a nitride layer, e.g., a silicon nitride, a silicon oxide nitride, other oxide/nitride layer, any other electrically insulating layer determined by an electronic device design, or any combination thereof. In one embodiment, insulating layer 104 comprises an interlayer dielectric (ILD), e.g., silicon dioxide. In one embodiment, insulating layer 111 may include polyimide, epoxy, photodefinable materials, such as benzocyclobutene (BCB), and WPR-series materials, or spin-on-glass. In one embodiment, insulating layer 104 is a low k ILD layer. Typically, the low-k is referred to the dielectrics having dielectric constant (k) lower than that of silicon dioxide.

In one embodiment, insulating layer 104 is blanket deposited using one or more deposition techniques, such as but not limited to a chemical vapor deposition (CVD), a physical vapor deposition (PVD), molecular beam epitaxy ("MBE"), metalorganic chemical vapor deposition ("MOCVD"), atomic layer deposition ("ALD"), or other insulating layer deposition technique known to one of ordinary skill in the art of microelectronic device manufacturing.

Figure 3:
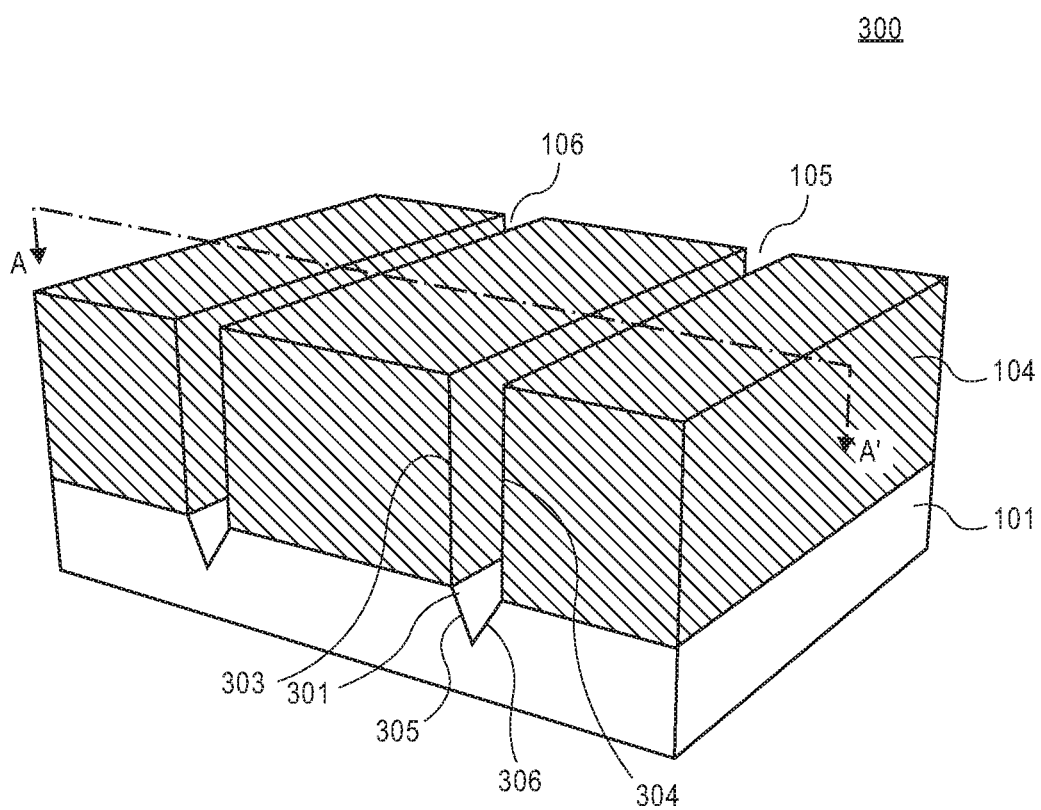
FIG. 3 is a view similar to FIG. 2 after the native fins are recessed according to one embodiment.

FIG. 3 is a view 300 similar to FIG. 2 after the native fins are recessed according to one embodiment. As shown in FIG. 3, native fins 102 and 103 are recessed to form trenches 105 and 106. In one embodiment, the native fins are removed to the depth that determines the height of the replacement material deposited later on in a process. In one embodiment, the shapes of the trenches 105 and 106 are controlled by the shapes of the native fins 102 and 103. In one embodiment, the size of each of the trenches 105 and 106 is controlled by the size of the corresponding native fin. In one embodiment, the trenches 105 and 106 are aspect ratio trapping (ART) trenches. Generally, aspect ratio trapping refers generally to one or more techniques that cause defects to terminate at non-crystalline, e.g., dielectric sidewalls, where the sidewalls are sufficiently high (at least 2 times) relative to the width of the trench. As a result, the top portion of the film grown in such a trench is device grade and devoid of defects.

As shown in FIG. 3, trench 105 in the insulating layer 104 has a bottom portion 301 and opposing sidewalls 303 and 304. In one embodiment, the bottom portion 301 has a V-shape with a {111} faceting. In one embodiment, the native fins 102 and 103 are etched to provide the {111} faceting at the bottom of the trenches 105 and 106 for growth of the III-V material later on in a process. As shown in FIG. 3, the V-shaped bottom 301 has a {111} facet 305 and a {111} facet 306 that are aligned along (111) crystallographic planes of the substrate 101, so that the trenches have a {111} faceted bottom. In another embodiment, the bottom of each of the trenches 105 and 106 is substantially flat and aligned along the (100) crystallographic plane of the substrate 101, so that the trenches have a {100} faceted bottom. In yet another embodiment, the bottom of each of the trench 105 and 106 has a circular shape, or any other shape. In one embodiment, the native fins are recessed selectively to insulating layer 104 using one or more etching techniques known to one of ordinary skill in the art of microelectronic device manufacturing, such as but not limited to a wet etching, a dry etching, or any combination thereof.

Figure 4:
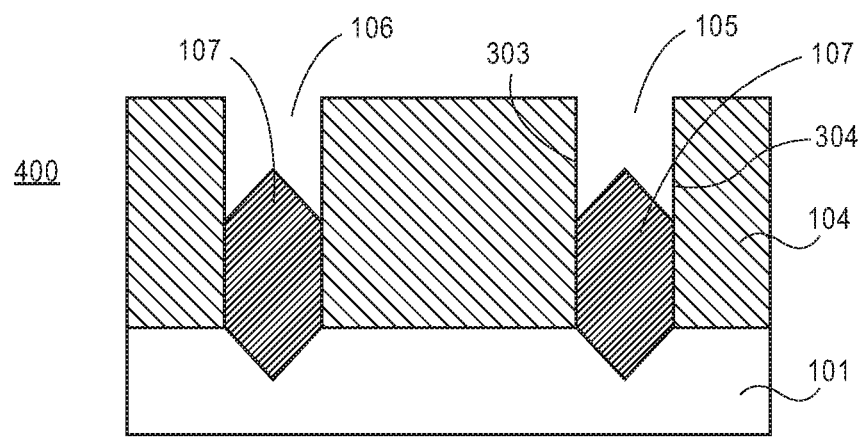
FIG. 4 is a cross-sectional view of the view shown in FIG. 3 along an axis A-A', after a sub-fin layer is deposited according to one embodiment.

FIG. 4 is a cross-sectional view 400 of the view 300 shown in FIG. 3 along an axis A-A', after a sub-fin layer 107 is deposited in the trenches according to one embodiment. As shown in FIG. 4, sub-fin layer 107 is deposited onto the bottom portions of the trenches 105 and 106. In one embodiment, sub-fin layer 107 acts as a buffer layer between the material of the substrate 101 and the replacement fin material deposited thereon later in a process. In one non-limiting embodiment, the thickness of the sub-fin layer 107 is from about 100 nm to about 200 nm. In one embodiment, sub-fin layer 107 has a band gap greater than the compound material layer deposited later on in a process to prevent a parasitic leakage current from the source to drain of a transistor. In one embodiment, sub-fin layer 107 is GaAs, InP, Ge, InAlAs, GaP, InGaP, an aluminum containing III-V layer, e.g., InAlAs, GaAlAs, a nitride containing III-V material, other III-V material layer, GaSb, AlGaSb or any combination thereof. In one embodiment, the sub-fin layer 107 is deposited to fill from about 40% to about 70% of the trench depth. In one embodiment, defects generated at the interface between the substrate 101 and the sub-fin layer 107 because of lattice mismatch are terminated by the sidewalls of the insulating layer trenches via ART technique.

In one embodiment, the sub-fin layer 107 is deposited using one of epitaxial growth techniques, such as but not limited to a chemical vapour deposition (CVD), a physical vapour deposition (PVD), molecular beam epitaxy ("MBE"), metalorganic chemical vapor deposition ("MOCVD"), atomic layer deposition ("ALD"), or other monocrystalline deposition technique known to one of ordinary skill in the art of microelectronic device manufacturing.

Figure 5:
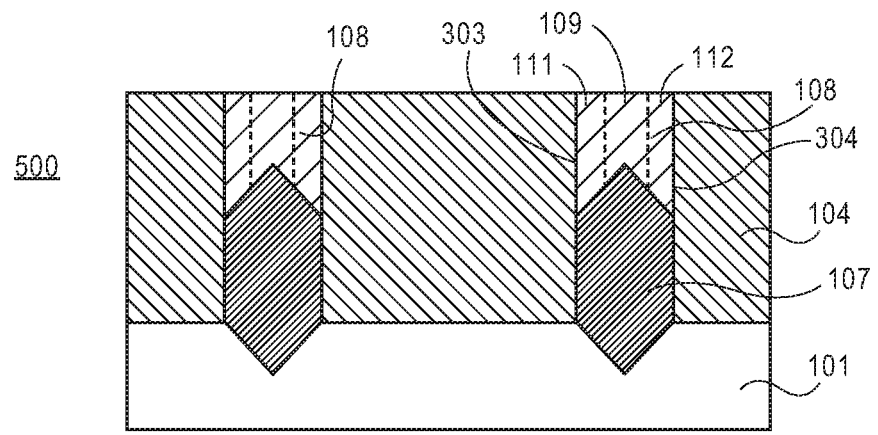
FIG. 5 is a view similar to FIG. 4, after a replacement fin layer is deposited according to one embodiment.

FIG. 5 is a view 500 similar to FIG. 4, after a replacement fin layer 108 is selectively deposited on the sub-fin layer 107 in the trenches according to one embodiment. In one embodiment, the replacement fin layer is grown in-situ on the sub-fin layer, as described above with respect to FIG. 4. In this embodiment, the sub-fin layer 107 is grown to a predetermined height within the trenches isolated by the insulating layer 104 and the replacement layer 108 is deposited in-situ on the sub-fin layer. In another embodiment, the replacement fin layer is grown ex-situ on the sub-fin layer in a recess and regrowth process. In this embodiment, the sub-fin layer 107 is deposited in the trenches and on the top surface of the insulating layer using one of the sub-fin layer deposition techniques. The portions of the sub-fin layer on the top surface of the insulating layer are removed using e.g., a polishing technique (e.g., a chemical mechanical planarization (CMP)). The sub-fin layer in the trenches is recessed to a predetermined depth using e.g., one of etching techniques, and then the replacement fin layer 108 is deposited on the recessed sub-fin layer using one of the replacement fin layer deposition techniques. As shown in FIG. 5, the replacement fin layer 108 comprises an edge portion 111 at sidewall 303 and an edge portion 112 at sidewall 304 of the trench 105. Replacement fin layer 108 has a core portion 109 at the middle portion of the trench 105 between the edge portion 111 and edge portion 112.

In one embodiment, the replacement fin layer 108 is a ternary compound material layer having at least three elements. In one embodiment, the at least two elements of the fin replacement layer 108 are group III elements (e.g., aluminum ("Al"), gallium ("Ga"), indium ("In")), and at least one elements of the fin replacement layer 108 is a group V element of the periodic table (e.g., nitrogen ("N"), phosphorus ("P"), arsenic ("As"), antimony ("Sb")), or any combination thereof. In one embodiment, the replacement fin layer 108 is InGaAs, InGaP, InGaSb, or other indium and gallium containing ternary compound material layer. In one embodiment, the replacement fin layer 108 is at least a quarternary III-V material layer that has at least two group III elements of the periodic table including indium and gallium, and at least one group V element of the periodic table. In one embodiment, the replacement fin layer 108 is InAlGaAs, InGaAsSb, or other indium and gallium containing quaternary compound material layer.

In one embodiment, the replacement fin layer 108 has a non-uniform composition content in the trench, so that the first component content in each of portions 111 and 112 is greater than in portion 109, and a second component content in portion 109 is greater than in the portions 111 and 112. In one embodiment, replacement fin layer 108 is an InGaAs layer, and each of portions 111 and 112 has the indium content that is greater than the indium content in portion 109, and the portion 109 has the gallium content that is greater than the gallim content in each of the portions 111 and 112. In more specific embodiment, the portions 111 and 112 have from about 60% to 80% of indium content, from about 20% to 40% of gallium content; where arsenic content is 100%. In more specific embodiment, the portion 109 has about 60% to 80% of gallium content, and about 20% to 40% of indium content; where arsenic content is 100%.

In one embodiment, the trench width is in an approximate range of 8 nm to 50 nm and the trench depth is in an approximate range of 100 nm to 300 nm. In one embodiment, the width of each of portions 111 and 112 is in an approximate range of 3 nm to 15 nm and the width of portion 109 is in an approximate range of 2 nm to 44 nm.

In one embodiment, the replacement fin layer 108 is deposited on sub-fin layer 107 to fill the rest of the trench. In one embodiment the replacement fin layer 108 fills from about 20% to 50% of the depth of the trench. In one non-limiting embodiment, the thickness of the replacement fin layer 108 is from about 20 nm to about 80 nm. In one embodiment, the replacement fin layer 108 is overgrown above the top surface of the insulating layer 104, and then planarized to even out the top surface of the replacement fin layer 108 with the top surface of the insulating layer 104.

In one embodiment, the replacement fin layer is deposited on the buffer layer in the trenches using one of epitaxial growth techniques, such as but not limited to a chemical vapour deposition (CVD), a physical vapour deposition (PVD), molecular beam epitaxy ("MBE"), metalorganic chemical vapor deposition ("MOCVD"), atomic layer deposition ("ALD"), or other monocrystalline deposition technique known to one of ordinary skill in the art of microelectronic device manufacturing. In one embodiment, the replacement fin layer 108 is planarized using one of the CMP techniques known to one of ordinary skill in the art of microelectronic device manufacturing.

Figure 13:
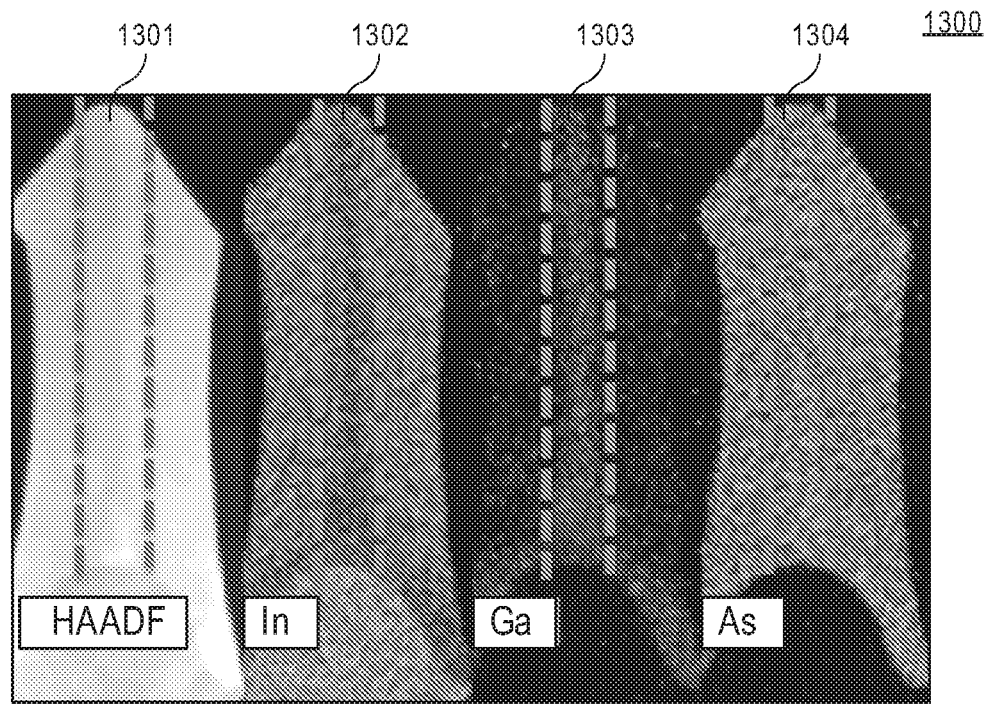
FIG. 13 is a view showing scanning transmission electron microscope (STEM) composition analysis images according to one embodiment.

FIG. 13 is a view 1300 showing scanning transmission electron microscope (STEM) composition analysis images of the replacement fin material deposited in the trench in the insulating layer according to one embodiment. An image 1301 shows an InGaAs fin. An image 1302 shows distribution of indium content, an image 1303 shows distribution of gallium content, and an image 1304 shows distribution of arsenic content in the fin of image 1301. The composition gradient of InGaAs is clearly visible in these images. As shown in image 1302, the indium content is greater at the edge portions than at the middle (core) portion of the fin. As shown in image 1303, the gallium content is greater at the core portion than at the edge portions of the fin.

Figure 14:
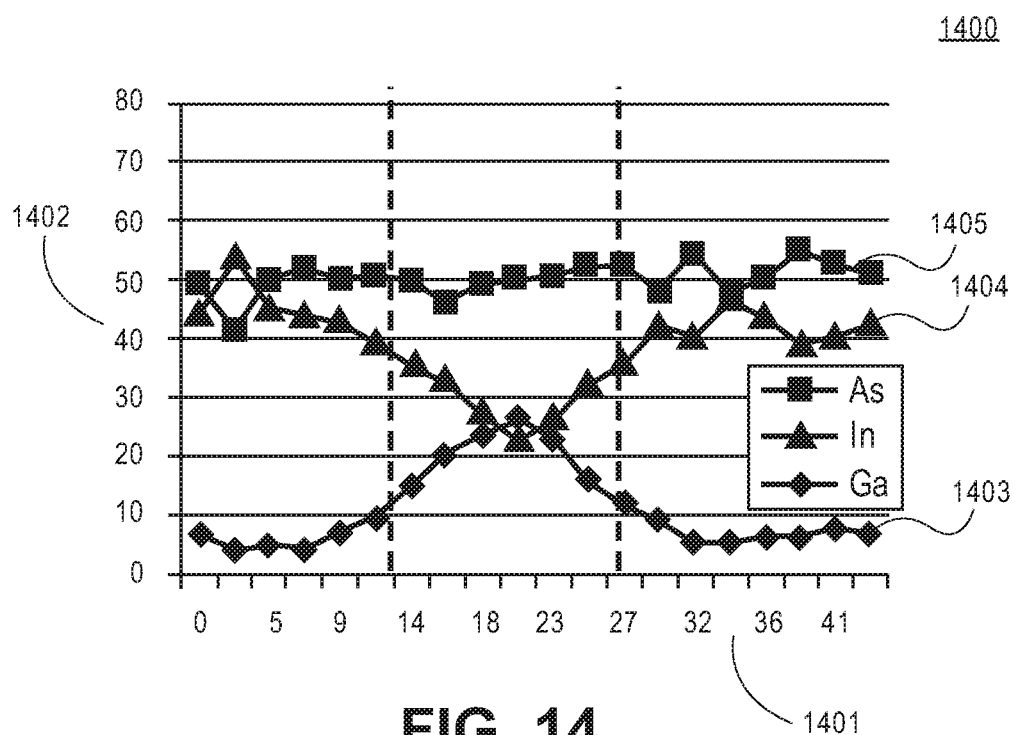
FIG. 14 is a view of a graph showing a component content versus a distance along the fin width according to one embodiment.

FIG. 14 is a view of a graph 1400 showing a component content 1402 (in percent) versus a distance along the fin width (in arbitrary units) according to one embodiment. A curve 1403 shows a percent distribution of the Ga content, a curve 1404 shows a percent distribution of the In content, and a curve 1405 shows a percent distribution of the arsenic content along the width of the InGaAs fin shown in FIG. 13. As shown in FIGS. 13 and 14, the as deposited InGaAs fin has indium-rich sides and the gallium-rich core.

Figure 6:
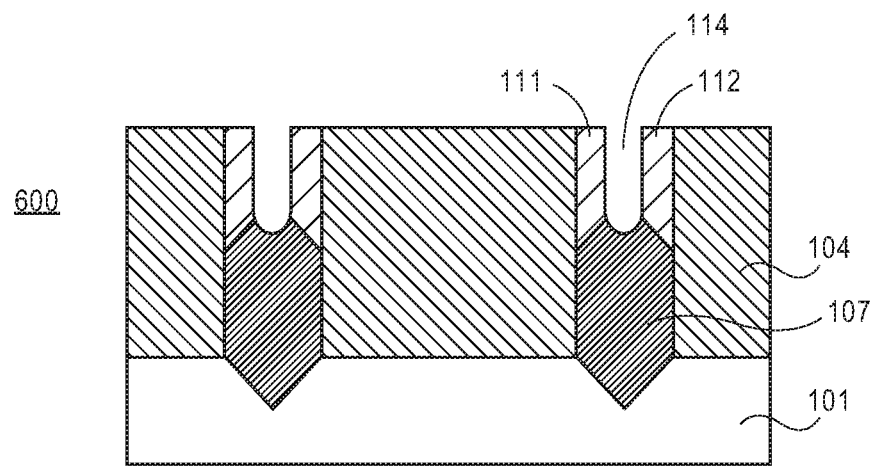
FIG. 6 is a view similar to FIG. 5, after the core portion is etched according to one embodiment.

FIG. 6 is a view 600 similar to FIG. 5 after the core portion 109 is etched according to one embodiment. As shown in FIG. 6, the core portion 109 is etched down to sub-fin layer 107 to form a space 114 between the edge portions 111 and 112, so that a double fin structure is created. In one embodiment, the double fin structure comprises two opposing fins represented by the edge portions 111 and 112 that extend from sub-fin layer 107. In one embodiment, the core portion 109 of the gallium-rich InGaAs is selectively etched relative to edge portions 111 and 112 using a hydroxide based chemistry (e.g., potassium hydroxide (KOH), ammonium hydroxide (NH$_4$OH), sodium hydroxide (NaOH), or other hydroxide based chemistry).

In one embodiment, the core portion 109 is etched using one of etching techniques known to one of ordinary skill in the art of microelectronic device manufacturing, such as but not limited to a wet etching, a dry etching, or any combination thereof. In an embodiment, the core portion 109 is etched using wet chemistry e.g., a KOH solution.

In one embodiment, the doubled fins structures are subsequently used as channel regions in field effect transistors (FET), trigate MOS transistors in a conventional process flow that can include a gate oxide, gate electrode, source/drain processing that may include an additional InAs layer and/or a contact resistance reducing metal and contacts, as described in further detail below.

Figure 7:
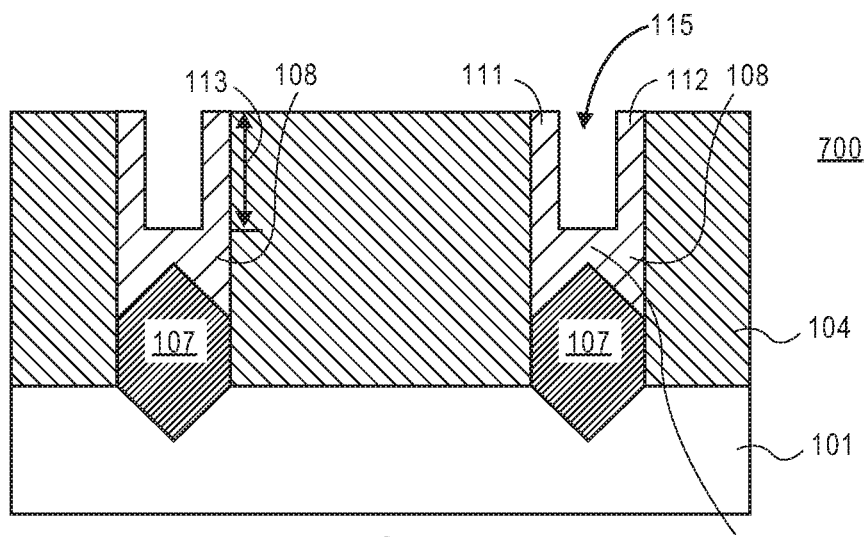
FIG. 7 is a view similar to FIG. 5 after the core portion is etched according to one embodiment.

FIG. 7 is a view 700 similar to FIG. 5 after the core portion 109 is etched according to one embodiment. FIG. 7 is different from FIG. 6 in that the core portion 109 is etched down to a predetermined depth 113 so that a portion 701 of the core portion 109 remains on the sub-fin layer 107. As shown in FIG. 7, the edge portions 111 and 112 are separated by a space 115. In one embodiment, the core portion 109 is etched to a predetermined depth using one of core portion etching techniques described above with respect to FIG. 6.

Figure 8:
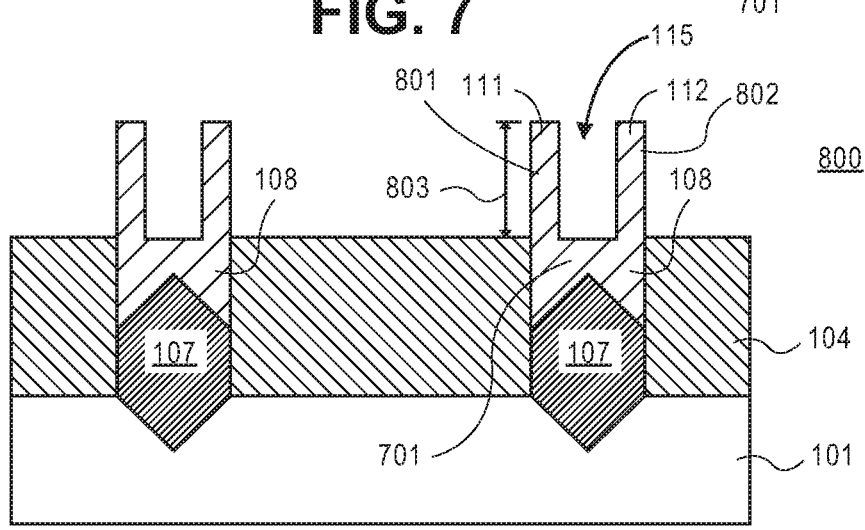
FIG. 8 is a view similar to FIG. 7, after the insulating layer is recessed according to one embodiment.
Figure 10:
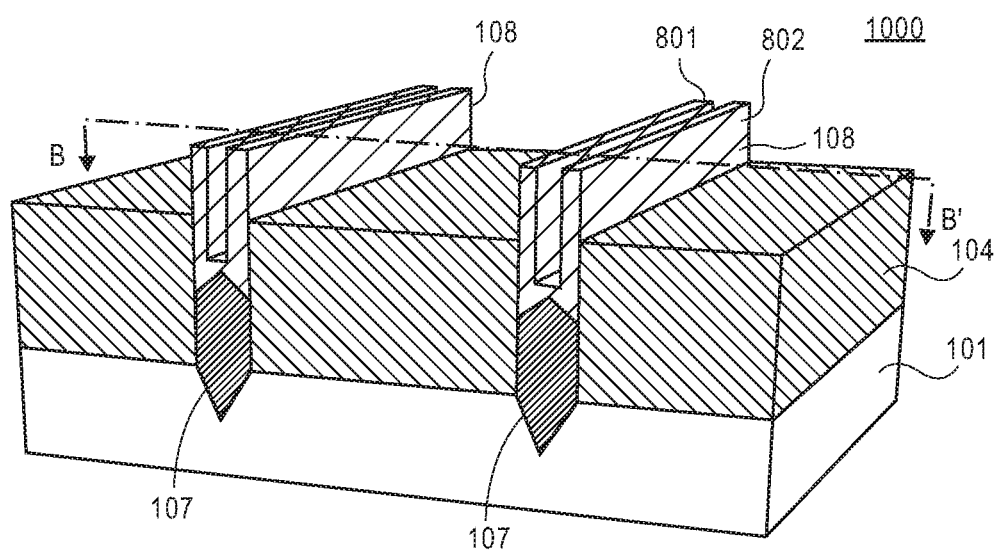
FIG. 10 is a perspective view of the portion of the electronic device structure shown in FIG. 8 according to one embodiment.

FIG. 8 is a view 800 similar to FIG. 7, after insulating layer 104 is recessed according to one embodiment. FIG. 10 is a perspective view 1000 of the portion of the electronic device structure shown in FIG. 8 according to one embodiment. View 800 is a cross-sectional view of the portion of the electronic device structure shown in FIG. 10 along an axis B-B'.

As shown in FIGS. 8 and 10, the insulating layer 104 is recessed down to a predetermined depth 803 to expose sidewalls of the portions 111 and 112 to form a double fin structure comprising two opposing fins 801 and 802 separated by space 115 that extend from core portion 701. The width of each of the fins 801 and 802 is smaller than the width of the original replacement fin deposited in the trench 105. As shown in FIG. 8, the depth 803 defines the height of the doubled fins 801 and 802 that exude above the top surface of the recessed insulating layer 104. In one embodiment, the insulating layer 104 is recessed down to a top surface of sub-fin layer 107, so that a top surface of the recessed insulating layer 104 is at a level of the top surface of the sub-fin layer 107.

In an embodiment, the insulating layer 104 is recessed using one of etching techniques known to one of ordinary skill in the art of microelectronic device manufacturing, such as but not limited to a wet etching, a dry etching, or any combination thereof. In an embodiment, insulating layer 104 of silicon oxide is etched using wet chemistry e.g., a hydrofluoric acid ("HF") solution or dry chemistry e.g., a halogen plasma etch.

In one embodiment, the fin doubling involves selectively etching off the gallium-rich core portion relative to the In-rich edge portions in an as-grown InGaAs fin using a KOH based chemistry, so that two indium-rich individual fins are created at the un-etched indium-rich sides of the original InGaAs fin.

In one embodiment, each of the individual indium-rich fins is trimmed at the sides to reduce the width of the fin-based transistor body. As the indium content in each of the individual fins 801 and 802 is substantially uniform, trimming does not result in loss of the indium content in the individual fin. That is, as the composition of the InGaAs in these individual fins is homogenous, trimming the fins at the sides does not reduce the indium content that remains substantially the same as before trimming.

Figure 9:
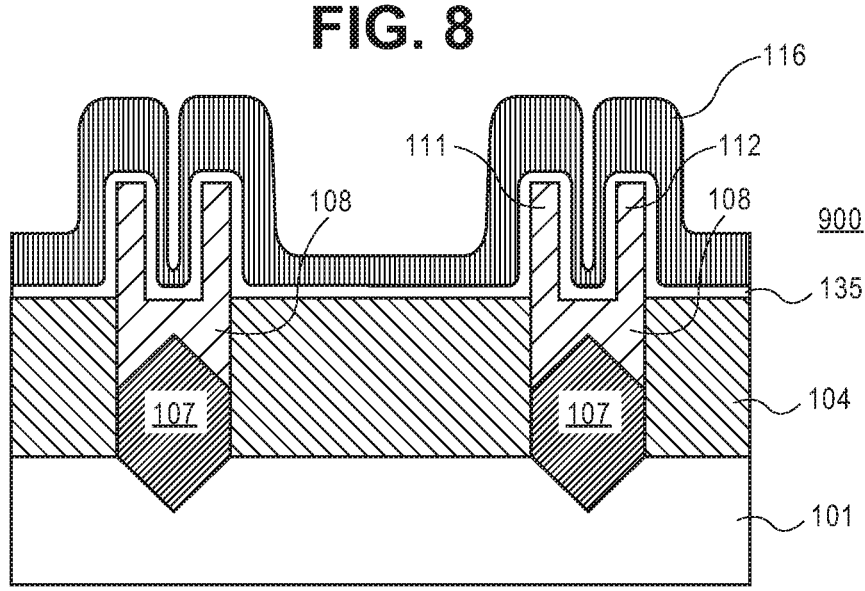
FIG. 9 is a view similar to FIG. 8 after a gate electrode layer is formed on a gate insulating layer on a double fin structure according to one embodiment.

FIG. 9 is a view 900 similar to FIG. 8 after a gate electrode layer 116 is formed on a gate insulating layer 135 on the double fin structure according to one embodiment. As shown in FIG. 9, the gate dielectric layer 135 is deposited on the top portion and opposing sidewalls of each of the doubled fins 801 and 802. Gate electrode layer 116 is deposited on gate dielectric layer 135. In one embodiment, the gate dielectric layer 135 is an oxide layer, e.g., a silicon oxide layer, an aluminum oxide, a hafnium containing oxide, or any combination thereof. In one embodiment, the gate dielectric layer 135 is a high-k dielectric material, for example, hafnium oxide, hafnium silicon oxide, hafnium zirconium oxide (HfxZryOz), lanthanum oxide (La2O3), lanthanum aluminum oxide, zirconium oxide, zirconium silicon oxide, tantalum oxide, tantalum silicate (TaSiOx), titanium oxide, barium strontium titanium oxide, barium titanium oxide, strontium titanium oxide, yttrium oxide, aluminum oxide (e.g., Al2O3), lead scandium tantalum oxide, and lead zinc niobate, or other high-k dielectric materials. In one embodiment, the thickness of the gate dielectric layer is from about 2 angstroms (Å) to about 20 Å.

In alternative embodiments, the gate dielectric layer is deposited using one of deposition techniques, such as but not limited to, a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing. The gate dielectric layer is patterned and etched using one or more gate dielectric layer patterning and etching techniques known to one of ordinary skill in the art of microelectronic device manufacturing.

The gate electrode layer 116 can be formed of any suitable gate electrode material. The gate electrode may comprise a metal-containing material e.g., Pt/Au, Ti/Au, Ti/Pt/Au, or another material or materials. In various embodiments, the material or materials of the gate electrode layer 116 may be chosen to provide a desired work function or doped appropriately to facilitate an ohmic contact. In an embodiment, the gate electrode layer 116 can be a metal gate electrode layer, such as but not limited to, tungsten, tantalum, titanium, and their nitrides. It is to be appreciated, the gate electrode layer need not necessarily be a single material and can be a composite stack of thin films, such as but not limited to a polycrystalline silicon/metal electrode or a metal/polycrystalline silicon electrode. The gate electrode layer 116 can be deposited using one of the gate electrode layer deposition techniques known to one of ordinary skill in the art of microelectronic device manufacturing.

Figure 11:
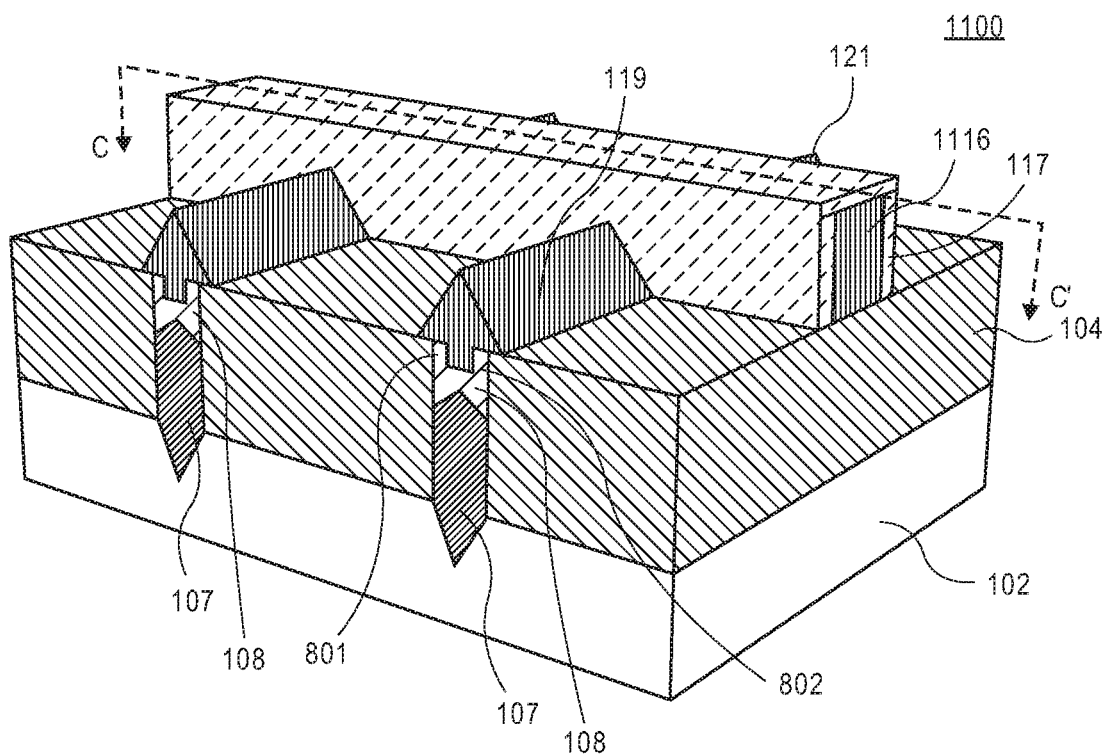
FIG. 11 is a perspective view of the portion of electronic device structure, after a spacer layer is deposited on a gate electrode and source and drain regions are formed according to one embodiment.

FIG. 11 is a perspective view 1100 of the portion of electronic device structure, after a spacer layer is deposited on a gate electrode and source and drain regions are formed at the opposite sides of the gate electrode according to one embodiment. The cross-sectional view along axis C-C' without the spacer layer is shown in FIG. 9. As shown in FIG. 11, a spacer layer 117 is deposited on the gate electrode 1116 using one of the spacer deposition techniques known to one of ordinary skill in the microelectronic device manufacturing.

In one embodiment, forming the gate electrode 1116 involves patterning and etching gate electrode layer 116 using one or more gate electrode patterning and etching techniques known to one of ordinary skill in the art of microelectronic device manufacturing. Source and drain regions, such as a source region 119 and a drain region 121 are formed on the doubled fins at opposite sides of the gate electrode 1116, as shown in FIG. 11. In one embodiment, forming the source and drain regions involves removing portions of the double fin structure comprising doubled fins 801 and 802 at opposite sides of the gate electrode 1116 to form recesses, e.g., by etching, and depositing the source/drain material into the recesses using one of the source/drain material deposition techniques. In another embodiment, forming the source and drain regions involves directly depositing the source/drain material on portions of the double fin structure comprising doubled fins 801 and 802 at opposite sides of the gate electrode 1116. In yet another embodiment, the source region 119 and drain region 121 wrap around portions of the doubled fin structure including doubled fins 801 and 802 at opposite sides of the gate electrode 1116. In one embodiment, source region 119 and drain region 121 are formed as faceted overgrowth regions, as shown in FIG. 11.

In one embodiment, the spacer layer is patterned and etched using patterning and etching techniques known to one of ordinary skill in the art of microelectronic device manufacturing to form spacers. In one embodiment, the spacers are nitride spacers (e.g., silicon nitride), oxide spacers, carbide spacers (e.g., silicon carbide), or other spacers. In one embodiment, the source/drain regions are formed on the areas of the etched doubled fins 801 and 802 defined by the spacers at opposite sides of the gate electrode

1116 using one of the source/drain forming techniques known to one of ordinary skill in the art of electronic device manufacturing.

In another embodiment, a dummy (sacrificial) gate electrode is deposited on the dielectric layer on the doubled fins 801 and 802 prior to deposition of the final gate electrode layer. In one embodiment, the dummy gate electrode, or the dummy electrode and the underlying dummy dielectric are removed and replaced with a final gate electrode stack after source/drain regions are formed later in the process. Example dummy gate dielectric materials include silicon dioxide, and example dummy gate electrode materials include polysilicon, although any suitable dummy/sacrificial gate dielectric and/or electrode materials can be used. In one embodiment, the spacers are formed on the opposite sidewalls of the dummy gate electrode stack. In one embodiment, source/drain regions are grown on the areas of the doubled fins 801 and 802 defined by the spacers at opposite sides of the dummy gate electrode, and then the dummy gate electrode is replaced by the final gate electrode, as known to one of ordinary skill in the art of electronic device manufacturing.

In one embodiment, the electronic device structure 1100 is a non-planar transistor structure, and each pair of the doubled fins, such as doubled fins 801 and 802 is configured for a non-planar transistor (e.g., a tri-gate transistor, all around gate transistor, or other non-planar transistor). In one embodiment, each of the doubled fins, such as fins 801 and 802 has three sides including a top side and opposing sidewalls configured for a tri-gate transistor. In another embodiment, each of the doubled fins, such as fins 801 and 802 includes a nanowire for a nanowire transistor. In yet another embodiment, each of the doubled fins, such as fins 801 and 802 includes a nanoribbon for a nanoribbon transistor.

In an embodiment, the source/drain regions have a doping concentration in an approximate range from about $1\times10^{19}$ to about $1\times10^{21}$ atoms/cm$^3$. The portions of the doubled fins 801 and 802 underneath gate electrode 1116 between the source and drain regions 119 and 121 defines a channel region of a transistor. The channel region can also be defined as the area of the doubled fins 801 and 802 surrounded by the gate electrode 1116. At times however, the source/drain regions may extend slightly beneath the gate electrode through, for example, diffusion to define a channel region slightly smaller than the gate electrode length (Lg). In an embodiment, the channel region of the fin is intrinsic or undoped. In an embodiment, the channel region is lightly doped to about $1\times10^{17}$ atoms/cc to the conductivity type opposite to that of the source region and the drain region. For example, when the source and drain regions 119 and 121 are n-type doped, the channel region of the doubled fins 801 and 802 are very lightly p-type doped to about $1\times10^{17}$ atoms/cc.

In an embodiment, source region 119 is electrically coupled to a source landing pad (not shown) and the drain region 121 is electrically coupled to a drain landing pad (not shown). Alternatively, the source/drain regions can be coupled to higher levels of metallization (e.g., metal 1, metal 2, metal 3, and so on) used to electrically interconnect various components of the integrated circuit together into functional circuits.

Figure 12:
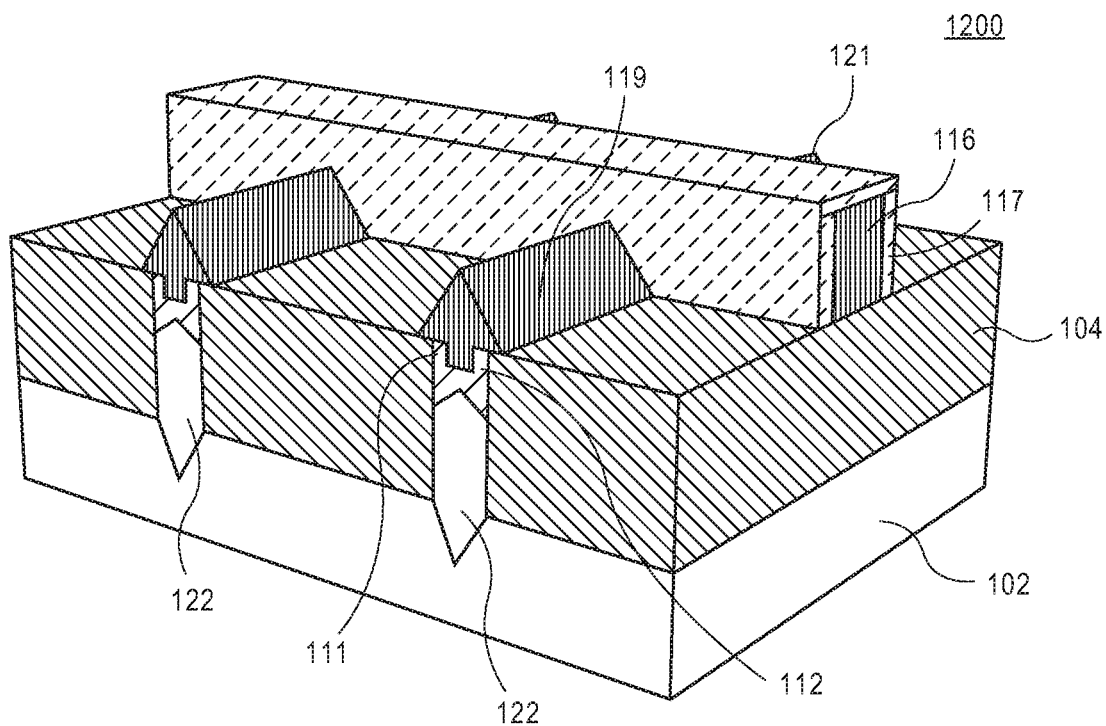
FIG. 12 is a perspective view of the portion of electronic device structure according to another embodiment.

FIG. 12 is a perspective view of the portion of electronic device structure 1200 according to another embodiment. FIG. 12 is different from FIG. 11 in that the sub-fin layer 107 is removed to create voids 122 underneath the double fin structure of the replacement fin layer 108. In one embodiment, the sub-fin layer 107 is removed selectively to the replacement material layer 108 using a wet etching, dry etching, or both techniques. In one embodiment, an arsenide based buffer layer is removed by selective etching using a hydroxide based chemistry to create voids 122 for a GAA process. In another embodiment, a phosphide based buffer layer is removed by etching using a halide (e.g., fluoride, chloride, bromide, or other halide) based chemistry to create voids 122 for a GAA process.

In one embodiment, the sub-fin layer 107 is etched out at a replacement metal gate (RMG) process before the final (actual) gates are deposited. In one embodiment, at the RMG location, the source and drain regions are protected by an insulator layer that permits etching of the buffer layer. In one embodiment, to access the sub-fin layer 107, the insulating layer 104 is additionally recessed to provide an effective etching action.

In one embodiment, after voids 122 are created, the process continues with a conventional GAA process flow. In one embodiment, voids 122 are used to reduce capacitive coupling between the adjacent transistors. In one embodiment, an insulating layer (not shown) is deposited into the voids 122 to reduce capacitive coupling by passivating the STI sidewalls. In one embodiment, the insulating layer deposited into the voids 122 is a low-k dielectric layer. In alternative embodiments, the insulating layer deposited into the voids is one or more insulating layers described above with respect to insulating layer 104.

In one embodiment, the electronic device structure 1200 includes a n-MOS transistor that is formed on the double fin structure described above.

Figure 15:
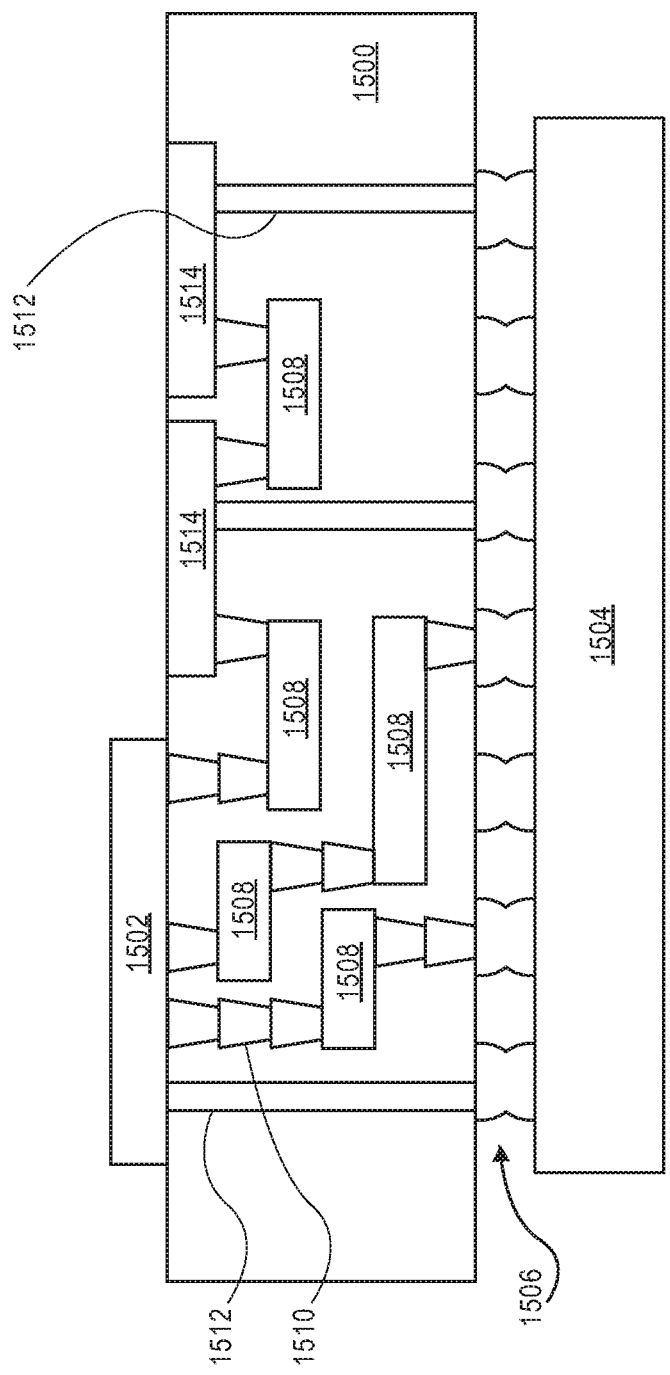
FIG. 15 illustrates an interposer that includes one or more embodiments of the invention.

FIG. 15 illustrates an interposer 1500 that includes one or more embodiments of the invention. The interposer 1500 is an intervening substrate used to bridge a first substrate 1502 to a second substrate 1504. The first substrate 1502 may be, for instance, an integrated circuit die. The second substrate 1504 may be, for instance, a memory module, a computer motherboard, or another integrated circuit die. Generally, the purpose of an interposer 1500 is to spread a connection to a wider pitch or to reroute a connection to a different connection. For example, an interposer 1500 may couple an integrated circuit die to a ball grid array (BGA) 1506 that can subsequently be coupled to the second substrate 1504. In some embodiments, the first and second substrates 1502/1504 are attached to opposing sides of the interposer 1500. In other embodiments, the first and second substrates 1502/1504 are attached to the same side of the interposer 1500. And in further embodiments, three or more substrates are interconnected by way of the interposer 1500.

The interposer 1500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1508, vias 1510, including but not limited to through-silicon vias (TSVs) 1512 and one or more maskless air gaps to prevent a via punch through as described above. The interposer 1500 may further include embedded devices 1514, including passive and active devices. Such devices include, but are not limited to, transistors including the double fin structures as described herein, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1500. In accordance with embodiments of the invention, apparatuses or processes disclosed herein may be used in the fabrication of interposer 1500.

Figure 16:
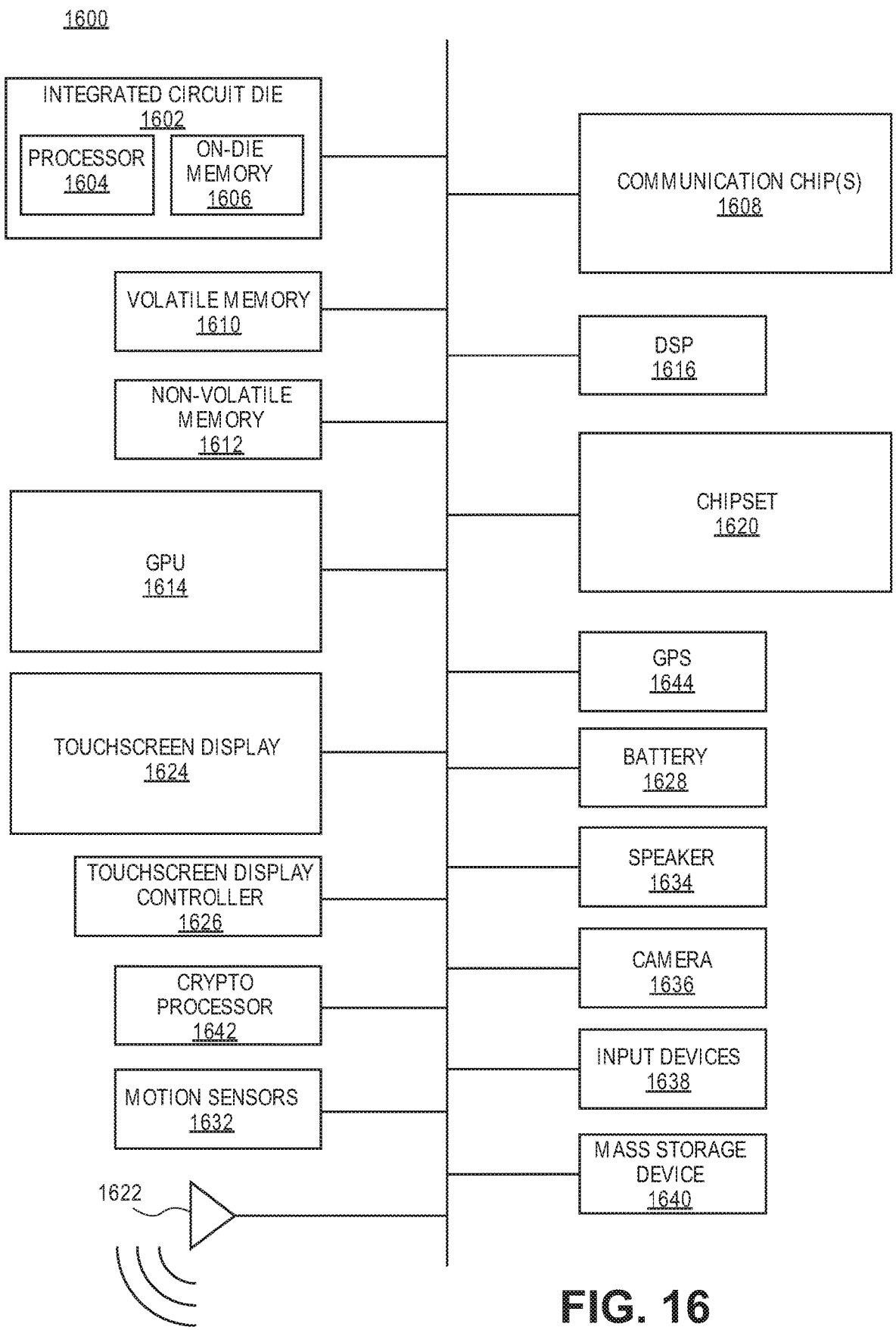
FIG. 16 illustrates a computing device in accordance with one embodiment of the invention.

FIG. 16 illustrates a computing device 1600 in accordance with one embodiment of the invention. The computing device 1600 may include a number of components. In one embodiment, these components are attached to one or more motherboards. In an alternate embodiment, these components are fabricated onto a single system-on-a-chip (SoC) die rather than a motherboard. The components in the computing device 1600 include, but are not limited to, an integrated circuit die 1602 and at least one communication chip 1608. In some implementations the communication chip 1608 is fabricated as part of the integrated circuit die 1602. The integrated circuit die 1602 may include a processor 1604 such as a central processing unit (CPU), an on-die memory 1606, often used as cache memory, that can be provided by technologies such as embedded DRAM (eDRAM) or spin-transfer torque memory (STTM or STTM-RAM).

Computing device 1600 may include other components that may or may not be physically and electrically coupled to the motherboard or fabricated within an SoC die. These other components include, but are not limited to, a volatile memory 1610 (e.g., DRAM), a non-volatile memory 1612 (e.g., ROM or flash memory), a graphics processing unit 1614 (GPU), a digital signal processor 1616 (DSP), a crypto processor 1642 (a specialized processor that executes cryptographic algorithms within hardware), a chipset 1620, an antenna 1622, a display or a touchscreen display 1624, a touchscreen display controller 1626, a battery 1628 or other power source, a global positioning system (GPS) device 1644, a power amplifier (PA), a compass, a motion coprocessor or sensors 1632 (that may include an accelerometer, a gyroscope, and a compass), a speaker 1634, a camera 1636, user input devices 1638 (such as a keyboard, mouse, stylus, and touchpad), and a mass storage device 1640 (such as hard disk drive, compact disk (CD), digital versatile disk (DVD), and so forth).

The communication chip 1608 enables wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1600 may include a plurality of communication chips 1608. For instance, a first communication chip 1608 may be dedicated to shorter range wireless communications such as Wi-Fi and Bluetooth and a second communication chip 1608 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. One or more components e.g., integrated circuit die 1602, communication chip 1608, GPU 1614, cryptoprocessor 1642, DSP 1616, chipset 1620, and other components may include one or more double fin structures formed in accordance with embodiments of the invention. In further embodiments, another component housed within the computing device 1600 may contain one or more double fin structures formed in accordance with embodiments of the invention.

In various embodiments, the computing device 1600 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1600 may be any other electronic device that processes data.

The above description of illustrated implementations of the invention, including what is described in the Abstract, is not intended to be exhaustive or to limit the invention to the precise forms disclosed. While specific implementations of, and examples for the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The following examples pertain to further embodiments:

In one embodiment, a method to manufacture an electronic device comprises selectively depositing a replacement fin layer on a sub-fin layer in trenches isolated by an insulating layer (e.g., STI, or other insulating layer, as described above) on a substrate, the replacement fin layer having first component rich side portions and a second component rich core portion; and etching the second component rich core portion to generate a double fin structure comprising the first component rich fins.

In one embodiment, a method to manufacture an electronic device comprises selectively depositing a replacement fin layer on a sub-fin layer in trenches isolated by an insulating layer on a substrate, the replacement fin layer having first component rich side portions and a second component rich core portion; and etching the second component rich core portion to generate a double fin structure comprising the first component rich fins, wherein each first component rich side portion is an element of group III material rich portion.

In one embodiment, a method to manufacture an electronic device comprises selectively depositing a replacement fin layer on a sub-fin layer in trenches isolated by an insulating layer (e.g., STI, or other insulating layer) on a substrate, the replacement fin layer having first component rich side portions and a second component rich core portion; and etching the second component rich core portion to generate a double fin structure comprising the first component rich fins, wherein the core portion is an element of group III material rich portion.

In one embodiment, a method to manufacture an electronic device comprises forming native fins on the substrate; depositing an insulating layer (e.g., STI, or other insulating layer) in between to isolate the native fins; recessing the native fins to create trenches; selectively depositing a replacement fin layer on a sub-fin layer in trenches isolated by the insulating layer on a substrate, the replacement fin layer having first component rich side portions and a second component rich core portion; and etching the second component rich core portion to generate a double fin structure comprising the first component rich fins.

In one embodiment, a method to manufacture an electronic device comprises selectively depositing a replacement fin layer on a sub-fin layer in trenches isolated by an insulating layer (e.g., STI, or other insulating layer) on a substrate, the replacement fin layer having first component rich side portions and a second component rich core portion; and etching the second component rich core portion to generate a double fin structure comprising the first component rich fins, wherein the sub-fin layer has a band gap greater than the replacement fin layer.

In one embodiment, a method to manufacture an electronic device comprises selectively depositing a replacement fin layer on a sub-fin layer in trenches isolated by an insulating layer (e.g., STI, or other insulating layer) on a substrate, the replacement fin layer having first component rich side portions and a second component rich core portion; and etching the second component rich core portion to generate a double fin structure comprising the first component rich fins, wherein the replacement fin layer on the sub-fin layer is grown in-situ.

In one embodiment, a method to manufacture an electronic device comprises selectively depositing a replacement fin layer on a sub-fin layer in trenches isolated by an insulating layer (e.g., STI, or other insulating layer) on a substrate, the replacement fin layer having first component rich side portions and a second component rich core portion; and etching the second component rich core portion to generate a double fin structure comprising the first component rich fins, wherein the replacement fin layer on the sub-fin is grown ex-situ in a two stage process of recess and regrowth.

In one embodiment, a method to manufacture an electronic device comprises selectively depositing a replacement fin layer on a sub-fin layer in trenches isolated by an insulating layer on a substrate, the replacement fin layer having first component rich side portions and a second component rich core portion; and etching the second component rich core portion to generate a double fin structure comprising the first component rich fins, wherein at least one of the trenches has a {111} faceted bottom.

In one embodiment, a method to manufacture an electronic device comprises selectively depositing a replacement fin layer on a sub-fin layer in trenches isolated by an insulating layer on a substrate, the replacement fin layer having first component rich side portions and a second component rich core portion; and etching the second component rich core portion to generate a double fin structure comprising the first component rich fins, wherein at least one of the trenches has a {100} faceted bottom.

In one embodiment, a method to manufacture an electronic device comprises selectively depositing a replacement fin layer on a sub-fin layer in trenches isolated by an insulating layer on a substrate, the replacement fin layer having first component rich side portions and a second component rich core portion; and etching the second component rich core portion to generate a double fin structure comprising the first component rich fins, wherein of at least one of the trenches has a circularly shaped bottom.

In one embodiment, a method to manufacture an electronic device comprises selectively depositing a replacement fin layer on a sub-fin layer in trenches isolated by an insulating layer on a substrate, the replacement fin layer having first component rich side portions and a second component rich core portion; and etching the second component rich core portion to generate a double fin structure comprising the first component rich fins, wherein the second component rich core portion is selectively etched using a hydroxide based chemistry.

In one embodiment, a method to manufacture an electronic device comprises selectively depositing a replacement fin layer on a sub-fin layer in trenches isolated by an insulating layer on a substrate, the replacement fin layer having first component rich side portions and a second component rich core portion; etching the second component rich core portion to generate a double fin structure comprising the first component rich fins; recessing the insulating layer; depositing a gate structure on the first component rich fins; and forming source/drain regions on the first component rich fins at opposite sides of the gate structure.

In one embodiment, a method to manufacture an electronic device comprises selectively depositing a replacement fin layer on a sub-fin layer in trenches isolated by an insulating layer on a substrate, the replacement fin layer having first component rich side portions and a second component rich core portion; and etching the second component rich core portion to generate a double fin structure comprising the first component rich fins, wherein the sub-fin layer is deposited to fill from about 50% to about 70% of the depth of the trenches.

In one embodiment, a method to manufacture an electronic device comprises selectively depositing a replacement fin layer on a sub-fin layer in trenches isolated by an insulating layer on a substrate, the replacement fin layer having first component rich side portions and a second component rich core portion; and etching the second component rich core portion to generate a double fin structure comprising the first component rich fins, wherein the fin layer is deposited to fill about 30% to from about 50% of the depth of the trenches.

In one embodiment, a method to manufacture an electronic device comprises selectively depositing a replacement fin layer on a sub-fin layer in trenches isolated by an insulating layer on a substrate, the replacement fin layer having first component rich side portions and a second component rich core portion; and etching the second component rich core portion to generate a double fin structure comprising the first component rich fins, wherein the core portion is etched down and stopped at the sub-fin layer.

In one embodiment, a method to manufacture an electronic device comprises selectively depositing a replacement fin layer on a sub-fin layer in trenches isolated by an insulating layer on a substrate, the replacement fin layer having first component rich side portions and a second component rich core portion; and etching the second component rich core portion to generate a double fin structure comprising the first component rich fins, wherein the core portion is etched down to a predetermined depth above the sub-fin layer.

In one embodiment, a method to manufacture an electronic device comprises selectively depositing a replacement fin layer on a sub-fin layer in trenches isolated by an insulating layer on a substrate, the replacement fin layer having first component rich side portions and a second component rich core portion; etching the second component rich core portion to generate a double fin structure comprising the first component rich fins; and removing the sub-fin layer to create a void.

In one embodiment, a method to manufacture an electronic device comprises forming native fins on a substrate; depositing an insulating layer to isolate the native fins; recessing the native fins to create trenches, selectively depositing a sub-fin layer into the trenches; selectively depositing a III-V material layer on the sub-fin layer, the III-V material fin layer having a first group III material rich side portion and a second group III material rich core portion; and removing the second group III material rich core portion to form a double fin structure comprising first group III material rich fins.

In one embodiment, a method to manufacture an electronic device comprises forming native fins on a substrate; depositing an insulating layer (e.g., STI, or other insulating layer) separating the native fins; recessing the native fins to create trenches, selectively depositing a sub-fin layer into the trenches; selectively depositing a III-V material layer on the sub-fin layer, the III-V material fin layer having a first group III material rich side portion and a second group III material rich core portion; and removing the second group III material rich core portion to form a double fin structure comprising first group III material rich fins, wherein the sub-fin layer comprises GaAs, InP, Ge, InAlAs, GaP, InGaP, InAlAs, GaAlAs, a nitride based compound semiconductor material, or any combination thereof.

In one embodiment, a method to manufacture an electronic device comprises forming native fins on a substrate; depositing an insulating layer (STI) separating the native fins; recessing the native fins to create trenches, selectively depositing a sub-fin layer into the trenches; selectively depositing a III-V material layer on the sub-fin layer, the III-V material fin layer having a first group III material rich side portion and a second group III material rich core portion; and removing the second group III material rich core portion to form a double fin structure comprising first group III material rich fins, wherein at least one of the trenches has a {111} faceted bottom.

In one embodiment, a method to manufacture an electronic device comprises forming native fins on a substrate; depositing an t insulating layer (STI) separating the native fins; recessing the native fins to create trenches, selectively depositing a sub-fin layer into the trenches; selectively depositing a III-V material layer on the sub-fin layer, the III-V material fin layer having a first group III material rich side portion and a second group III material rich core portion; and removing the second group III material rich core portion to form a double fin structure comprising first group III material rich fins, wherein at least one of the trenches has a {100} faceted bottom.

In one embodiment, a method to manufacture an electronic device comprises forming native fins on a substrate; depositing an insulating layer (STI) separating the native fins; recessing the native fins to create trenches, selectively depositing a sub-fin layer into the trenches; selectively depositing a III-V material layer on the sub-fin layer, the III-V material fin layer having a first group III material rich side portion and a second group III material rich core portion; and removing the second group III material rich core portion to form a double fin structure comprising first group III material rich fins, wherein at least one of the trenches has a circularly shaped bottom.

In one embodiment, a method to manufacture an electronic device comprises forming native fins on a substrate; depositing an insulating layer (STI, or other insulating layer) separating the native fins; recessing the native fins to create trenches, selectively depositing a sub-fin layer into the trenches; selectively depositing a III-V material layer on the sub-fin layer, the III-V material fin layer having a first group III material rich portion and a second group III material rich portion; and removing the second group III material rich portion to form a double fin structure comprising first group III material rich fins, wherein the second group III material rich portion is removed by etching using a hydroxide based chemistry.

In one embodiment, a method to manufacture an electronic device comprises forming native fins on a substrate; depositing an insulating layer separating the native fins; recessing the native fins to create trenches, selectively depositing a sub-fin layer into the trenches; selectively depositing a III-V material layer on the sub-fin layer, the III-V material fin layer having a first group III material rich portion and a second group III material rich portion; and removing the second group III material rich portion to form a double fin structure comprising first group III material rich fins; recessing the insulating layer; depositing a gate structure on the double fin structure; and forming source/drain regions on the double fin structure at opposite sides of the gate structure.

In one embodiment, a method to manufacture an electronic device comprises forming native fins on a substrate; depositing an insulating layer separating the native fins; recessing the native fins to create trenches, selectively depositing a sub-fin layer into the trenches; selectively depositing a III-V material layer on the sub-fin layer, the III-V material fin layer having a first group III material rich portion and a second group III material rich portion; removing the second group III material rich portion to form a double fin structure comprising first group III material rich fins; and removing the sub-fin layer to create a void.

In one embodiment, an electronic device comprises a sub-fin layer in trenches isolated by an insulating layer on a substrate; and a replacement fin layer comprising a first material component and a second material component on the sub-fin layer, wherein the replacement fin layer comprises a double fin structure comprising a plurality of the first material component rich fins.

In one embodiment, an electronic device comprises a sub-fin layer in trenches isolated by an insulating layer on a substrate; and a replacement fin layer comprising a first material component and a second material component on the sub-fin layer, wherein the replacement fin layer comprises a double fin structure comprising a plurality of the first material component rich fins, wherein the first material component is a first group III material component and the second material component is a second group III material component.

In one embodiment, an electronic device comprises a sub-fin layer in trenches isolated by an insulating layer on a substrate; and a replacement fin layer comprising a first material component and a second material component on the sub-fin layer, wherein the replacement fin layer comprises a double fin structure comprising a plurality of the first material component rich fins.

In one embodiment, an electronic device comprises a sub-fin layer in trenches isolated by an insulating layer on a substrate; and a replacement fin layer comprising a first material component and a second material component on the sub-fin layer, wherein the replacement fin layer comprises a double fin structure comprising a plurality of the first material component rich fins, wherein an interface between the substrate and the sub-fin layer has a {111} crystallographic orientation.

In one embodiment, an electronic device comprises a sub-fin layer in trenches isolated by an insulating layer on a substrate; and a replacement fin layer comprising a first material component and a second material component on the sub-fin layer, wherein the replacement fin layer comprises a double fin structure comprising a plurality of the first material component rich fins, wherein an interface between the substrate and the sub-fin layer has a {100} crystallographic orientation.

In one embodiment, an electronic device comprises a sub-fin layer in trenches isolated by an insulating layer on a substrate; and a replacement fin layer comprising a first material component and a second material component on the sub-fin layer, wherein the replacement fin layer comprises a double fin structure comprising a plurality of the first material component rich fins, wherein an interface between the substrate and the sub-fin layer has a circular shape.

In one embodiment, an electronic device comprises a sub-fin layer in trenches isolated by an insulating layer on a substrate; and a replacement fin layer comprising a first material component and a second material component on the sub-fin layer, wherein the replacement fin layer comprises a double fin structure comprising a plurality of the first material component rich fins, wherein the sub-fin layer has a band gap greater than the replacement fin layer.

In one embodiment, an electronic device comprises a sub-fin layer in trenches isolated by an insulating layer on a substrate; a replacement fin layer comprising a first material component and a second material component on the sub-fin layer, wherein the replacement fin layer comprises a double fin structure comprising a plurality of the first material component rich fins; a gate structure on the plurality of the double fin structure; and source/drain regions on the double fin structure at opposite sides of the gate structure.

In one embodiment, an electronic device comprises a sub-fin layer in trenches isolated by an insulating layer on a substrate; and a replacement fin layer comprising a first material component and a second material component on the sub-fin layer, wherein the replacement fin layer comprises a double fin structure comprising a plurality of the first material component rich fins, wherein the sub-fin layer is an insulating layer.

In one embodiment, an electronic device comprises a sub-fin layer in trenches isolated by an insulating layer on a substrate; and a replacement fin layer comprising a first material component and a second material component on the sub-fin layer, wherein the replacement fin layer comprises a double fin structure comprising a plurality of the first material component rich fins, wherein the plurality of first material component rich fins are on a portion of the replacement fin layer.

In one embodiment, an electronic device comprises a sub-fin layer on an insulating layer on a substrate; and a replacement fin layer comprising a first material component and a second material component on the sub-fin layer, wherein the replacement fin layer comprises a double fin structure comprising a plurality of the first material component rich fins, wherein the plurality of first material component rich fins are on the sub-fin layer.

In one embodiment, an electronic device comprises a sub-fin layer on an insulating layer on a substrate; and a replacement fin layer comprising a first material component and a second material component on the sub-fin layer, wherein the replacement fin layer comprises a double fin structure comprising a plurality of the first material component rich fins, wherein the double fin structure is a part of a trigate transistor.

In one embodiment, an electronic device comprises a sub-fin layer on an insulating layer on a substrate; and a replacement fin layer comprising a first material component and a second material component on the sub-fin layer, wherein the replacement fin layer comprises a double fin structure comprising a plurality of the first material component rich fins, wherein the sub-fin layer is released to create a void underneath the double fin structure to form a Gate All Around (GAA) transistor.

In the foregoing specification, methods and apparatuses have been described with reference to specific exemplary embodiments thereof. It will be evident that various modifications may be made thereto without departing from the broader spirit and scope of embodiments as set forth in the following claims. The specification and drawings are, accordingly, to be regarded in an illustrative sense rather than a restrictive sense.

What is claimed is:

1. An electronic device comprising:
   a sub-fin layer in trenches isolated by an insulating layer on a substrate, the insulating layer having a top surface; and
   a replacement fin layer comprising a first material component and a second material component on the sub-fin layer, wherein the replacement fin layer comprises a double fin structure comprising a first and a second first material component rich fins, wherein a second material component rich layer is between and joins the first and second first material component rich fins, the second material component rich layer on the sub-fin layer, wherein the second material component rich layer has a different composition than the sub-fin, wherein each of the first and second first material component rich fins has an inner sidewall, an outer sidewall, and a bottom surface, the bottom surface below the top surface of the insulating layer, wherein the inner sidewalls of the first and second first material component rich fins face one another, wherein the bottom surface is a sloped surface that slopes downwardly from the inner sidewall to the outer sidewall, and wherein a topmost surface of the second material component rich layer is below top surfaces of the first and second first material component rich fins.

2. The electronic device of claim 1, wherein the first material component is a first group III material component and the second material component is a second group III material component.

3. The electronic device of claim 1, wherein the replacement fin layer is a III-V material layer.

4. The electronic device of claim 1, further comprising:
   a gate structure on the double fin structure; and
   source/drain regions on the double fin structure at opposite sides of the gate structure.

5. The electronic device of claim 1, wherein the first and second first material component rich fins are on a portion of the sub-fin layer.

6. A computing device, comprising:
   a board; and
   a component coupled to the board, the component including an integrated circuit structure, comprising:
      a sub-fin layer in trenches isolated by an insulating layer on a substrate, the insulating layer having a top surface; and a replacement fin layer comprising a first material component and a second material component on the sub-fin layer, wherein the replacement fin layer comprises a double fin structure comprising a first and a second first material component rich fins, wherein a second material component rich layer is between and joins the first and second first material component rich fins, the second material component rich layer on the sub-fin layer, wherein the second material component rich layer has a different composition than the sub-fin, wherein each of the first and second first material component rich fins has an inner sidewall, an outer sidewall, and a bottom surface, the bottom surface below the top surface of the insulating layer, wherein the inner sidewalls of the first and second first material component rich fins face one another, wherein the bottom surface is a sloped surface that slopes downwardly from the inner sidewall to the outer sidewall, and wherein a topmost surface of the second material component rich layer is below top surfaces of the first and second first material component rich fins.

7. The computing device of claim 6, further comprising: a memory coupled to the board.

8. The computing device of claim 6, further comprising: a communication chip coupled to the board.

9. The computing device of claim 6, further comprising: a camera coupled to the board.

10. The computing device of claim 6, further comprising: a battery coupled to the board.

11. The computing device of claim 6, further comprising: an antenna coupled to the board.

12. The computing device of claim 6, wherein the component is selected from the group consisting of a processor, a communications chip, and a digital signal processor.

13. The computing device of claim 6, wherein the computing device is selected from the group consisting of a mobile phone, a laptop, a desk top computer, a server, and a set-top box.

14. The computing device of claim 6, wherein the first material component is a first group III material component and the second material component is a second group III material component.

15. The computing device of claim 6, wherein the replacement fin layer is a III-V material layer.

16. The computing device of claim 6, wherein the integrated circuit structure further comprises a gate structure on the double fin structure, and source/drain regions on the double fin structure at opposite sides of the gate structure.

17. The computing device of claim 6, wherein the first and second first material component rich fins are on a portion of the sub-fin layer.

18. An electronic device comprising:
a sub-fin layer in trenches isolated by an insulating layer on a substrate, the insulating layer having a top surface; and
a replacement fin layer comprising a first material component and a second material component on the sub-fin layer, wherein the replacement fin layer comprises a double fin structure comprising a pair of the first material component rich fins, wherein a second material component rich layer is between and joins first and second first material component rich fins of the pair of first material component rich fins, the second material component rich layer on the sub-fin layer, wherein the second material component rich layer has a different composition than the sub-fin, wherein each of the first material component rich fins has a bottom surface below the top surface of the insulating layer, wherein a portion of the sub-fin layer is laterally between the first material component rich fins, and wherein a topmost surface of the second material component rich layer is below top surfaces of the first and second first material component rich fins.

19. The electronic device of claim 18, wherein the first material component is a first group III material component and the second material component is a second group III material component.

20. The electronic device of claim 18, wherein the replacement fin layer is a III-V material layer.

* * * * *